United States Patent [19]

Bouchard et al.

[11] Patent Number: 4,680,468

[45] Date of Patent: Jul. 14, 1987

[54] PARTICLE DETECTOR

[75] Inventors: Claude Bouchard, Nepean; Pierre Boulanger, Vanier, both of Canada

[73] Assignee: Canadian Patents and Development Limited-Societe Canadienne des Brevets et d'Exploitation Limitee, Ottawa, Canada

[21] Appl. No.: 762,291

[22] Filed: Aug. 5, 1985

[51] Int. Cl.⁴ ............................................. G01N 23/22
[52] U.S. Cl. ................................... 250/310; 250/397; 250/399
[58] Field of Search ........... 250/281, 287, 288, 288 A, 250/299, 300, 399, 396 R, 397, 306, 310

[56] References Cited

U.S. PATENT DOCUMENTS

| | | | |
|---|---|---|---|
| 3,244,990 | 4/1966 | Herb et al. | 313/285 X |
| 3,474,245 | 10/1969 | Kimura et al. | 250/397 |
| 3,760,180 | 9/1973 | Weber | 250/305 |
| 4,011,450 | 3/1977 | Tagawa | 250/311 |
| 4,230,943 | 10/1980 | Franzen et al. | 250/281 |
| 4,241,259 | 12/1980 | Feurbaum et al. | 250/457 |
| 4,442,355 | 4/1984 | Tamura et al. | 250/397 |
| 4,490,610 | 12/1984 | Ulbricht, Jr. | 250/287 |

FOREIGN PATENT DOCUMENTS 0805445 2/1981 U.S.S.R. ............................... 250/306

OTHER PUBLICATIONS

Robinson, Electron Detectors Used for Imaging in the Scanning Electron Microscope, 3rd Pfefferkorn Conf. on Elec. Optical Systems, (1984).
Wells, "Scanning Electron Microscope," McGraw Hill, 1974, pp. 99-102.
Naik et al., "A New Modified Orbitron Pump," Proc. 6th Intl. Vacuum Conf., 1974, pp. 73-76.

Primary Examiner—Bruce C. Anderson
Assistant Examiner—Paul A. Guss

[57] ABSTRACT

A detector for charged particles, i.e. secondary electons ir ions emitted from a bombardment area of a specimen in an instrument such as a scanning electron microscope or analytical instrument, consists of a collector, e.g. a scintillation surface highly charged with a voltage of the opposite polarity from that of the particles, for receiving the particles and providing an output proportional to the number thereof. A grid, charged with a voltage of the same sign as the scintillation surface, but to a lower value, is located between the scintillation surface and the bombardment area, and a probe in the form of a wire electrically connected to the grid projects into the vicinity of the bombardment area which is in a confined space between the specimen and the instrument. The result is to set up an electrostatic field around the wire, causing a significant number of the charged particles to orbit the wire and travel to the scintillation surface. The detector has better performance in situations requiring a relatively long "reach" into a confined space than has been attainable with previously known detectors. As a result, the detector is especially useful when the speciment under examination is relatively large, e.g. a large silicon wafer.

16 Claims, 7 Drawing Figures

PARTICLE DETECTOR

BACKGROUND OF THE INVENTION

The invention relates to a particle detector for detecting secondary charged particles (electrons or ions) in analytical instruments or scanning electron microscopes, and, in particular, is concerned with a particle detector that can be used effectively when the specimen under examination is relatively large.

In a scanning electron microscope, for example, which is one of the principal uses of the invention, the specimen would traditionally have a transverse dimension of 1 to 2 cm., and would present no special problem in locating a detector sufficiently close to all parts of such a specimen as to effectively detect the secondary electrons emitted from the various different parts of the specimen as the primary beam is scanned over a bombardment area of the specimen. Recently, however, it has become convenient to use a scanning electron microscope to examine substantially larger specimens, e.g. large silicon wafers and the like, which may have transverse dimensions of the order of up to 10 cm. The distance between the final lens of the electron microscope and the specimen needs to be kept short for good resolution, and the space available for the detector will therefore be limited. As a result, the main elements of the detector will necessarily be located beyond the lateral limits of the lens and the specimen. Yet the detector will be required to detect secondary electrons that are generated in the specimen at a bombardment area determined by the primary electron beam which emerges from the centre of the lens. In other words a detector in such a situation is required to have a much longer "reach" into the confined space between the specimen and the lens than has previously been necessary. Ideally this reach should be acquired without significant loss of performance.

Examples of analytical instruments in which a similar problem is posed by the increasing size of specimens and overcrowding of probes, detectors and specimens, and to which the present invention applies, are electron, ion or particle probe instruments with any combination of mass spectrometers, X-ray detectors, light detectors, back scattered electron detectors, secondary electron detectors, energy spectroscopes for chemical analysis or other electron energy analysers, Auger analysers and other analysers of the type that use an ion gun. Each of these instruments, as it scans an incident beam or ray over the specimen, causes different bombardment areas of the specimen to emit secondary electrons, back scattered electrons or ions, positive or negative. The detector collects and counts these secondary charged particles. The detector output and the scan coordinates are supplied to a computer which uses this data to produce an image or "signature" of the specimen from which much desired information can be obtained.

PRIOR ART

Typical detectors for scanning electron microscopes are disclosed in U.S. Pat. No. 4,011,450 issued Mar. 8, 1977 to T. Tagawa et al. and U.S. Pat. No. 4,241,259 issued Dec. 23, 1980 to H. P. Feuerbaum et al. U.S. Pat. No. 3,760,180 issued Sept. 18, 1973 shows an Auger electron detector in a micro-analyser. However, none of these instruments can be used effectively with large specimens, i.e. those having a transverse dimension of over about 2 to 3 cm.

A convenient summary of the various different types of so-called backscattered electron detectors that have been developed for use in scanning electron microscopes is provided in an article entitled "Electron Detectors used for Imaging in the Scanning Electron Microscope" by V. N. E. Robinson, presented to the 3rd Pfefferkorn Conference on The Electron Optical Systems held in Ocean City, Maryland in 1984. A further example of a typical electron detector is provided in the book by O. C. Wells, "Scanning Electron Microscope" pp 99–102, published in 1974 by McGraw-Hill Inc.

Such an electron detector typically has a highly positively charged scintillation surface that receives the electrons and emits light that passes to a photo-multiplier tube for providing a count of the number of electrons. In some instruments the electrons are detected by a dynode surface or by a Faraday cage. In an analytical instrument that produces secondary positive or negative ions, a similar, appropriately charged detection surface or device will be used.

SUMMARY OF THE INVENTION

The present invention provides a solution to the problem of effectively reaching into a confined space by utilising a construction that functions in a manner analogous to the orbitron principle that has been employed in developing getter ion pumps for achieving high vacuums. See, for example, "A New Modified Orbitron Pump" by P. K. Naik et al. published in Proceedings 6th International Vacuum Congress 1974 pages 21–24.

More specifically, the invention provides a grid or similar structure between the scintillation surface or other electron or ion detecting device, and the bombardment area, this grid having applied to it a voltage of the same sign but smaller in value than that applied to the detecting device. The invention further provides an elongate probe (conveniently a single, thin wire) to which there is applied a potential of the same sign as that applied to the grid, this probe projecting into the confined space between the specimen and the instrument. The probe extends to the vicinity of the bombardment area. The charge on the probe forms an electrostatic field around it, which field both serves an energy selection function and causes a significant number of the charged particles to travel to the detecting device while orbiting the probe.

While the probe can extend directly towards the bombardment area, i.e. in a direction that intersects a normal to this area, improved results have been obtained by slightly off-setting the probe, i.e. extending it in a direction that makes a small angle, e.g. 2° or 3°, with the intersecting direction.

DESCRIPTION OF THE PREFERRED EMBODIMENTS

Figure 1:
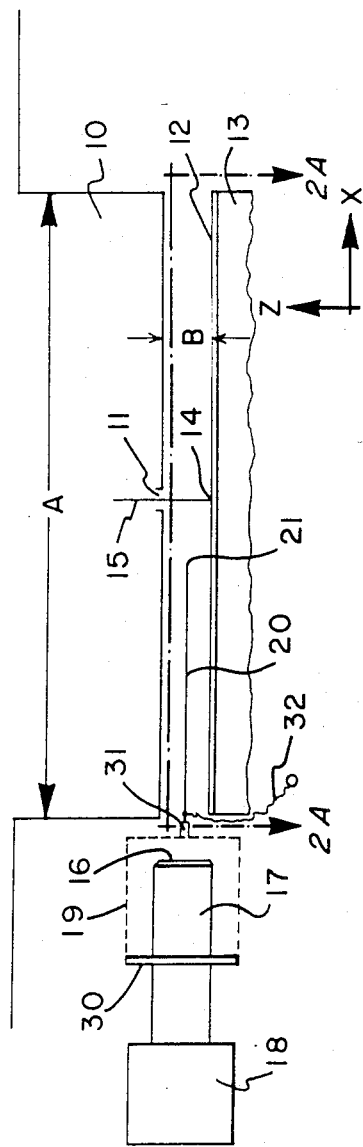
FIG. 1 is a side view of an embodiment of the invention.

FIG. 1 shows the final magnetic lens 10 of a scanning electron microscope with an aperture 11 through which an electron beam 15 is projected onto a bombardment area of a specimen 12 which is mounted on a movable platform 13 for indexing the specimen in the X and Y directions relative to the lens 10. This indexing is necessary because the scanning achievable by the conventional scanning coil in the lens 10 can cover only a small part of the surface area of the specimen. For purposes of illustration of the general dimensional magnitudes involved, it is assumed that the lens 10 has a diameter A of 10 cm. and that the specimen 12 is circular and has the same transverse dimension, although obviously these dimensions can be varied.

The platform 13 will also be capable of moving the specimen 12 relative to the lens 10 in the Z direction. The smaller the spacing B between the lens and the specimen in this Z direction, the better the resolution of the instrument will be, and hence it is desirable to keep the spacing B small, e.g. between 8 and 12 mm. The smallness of this spacing, however, presents a problem in locating a detector in this confined space close to the bombardment area, which is here shown as a point of impact 14 of the electron beam 15. On the other hand, the radius of this lens, e.g. 5 cm., means that the detection of secondary electrons generated in the specimen by the beam would be very inefficient if a conventional detector were located at a conventional location, i.e. beyond the lateral extent of both the lens and the specimen.

A conventional detector, e.g. a Everhart-Thornley electron detector, consists essentially of a scintillation surface 16 connected by a light guide 17 to a photo-multiplier tube 18. A high positive voltage, e.g. 8 to 12 kV, is applied to the scintillation surface 16 and some form of electrostatic field shaping is employed to ensure that the secondary electrons emitted by the specimen impinge upon the scintillation surface.

In the present construction the surface 16 is surrounded by a cage 19 (acting as a grid) located between the scintillation surface 16 and the specimen, and supported by an insulator 30 mounted on the light guide 17, such cage having applied to it a positive voltage lower than that on the scintillation surface. In the embodiment of FIG. 1, a positive voltage in the range of 8 to 15 kV, and preferably 12 kV, is applied to the scintillation surface 16 and a positive voltage up to 600 V, and preferably about 400 V, is applied to the cage 19.

Figure 3:
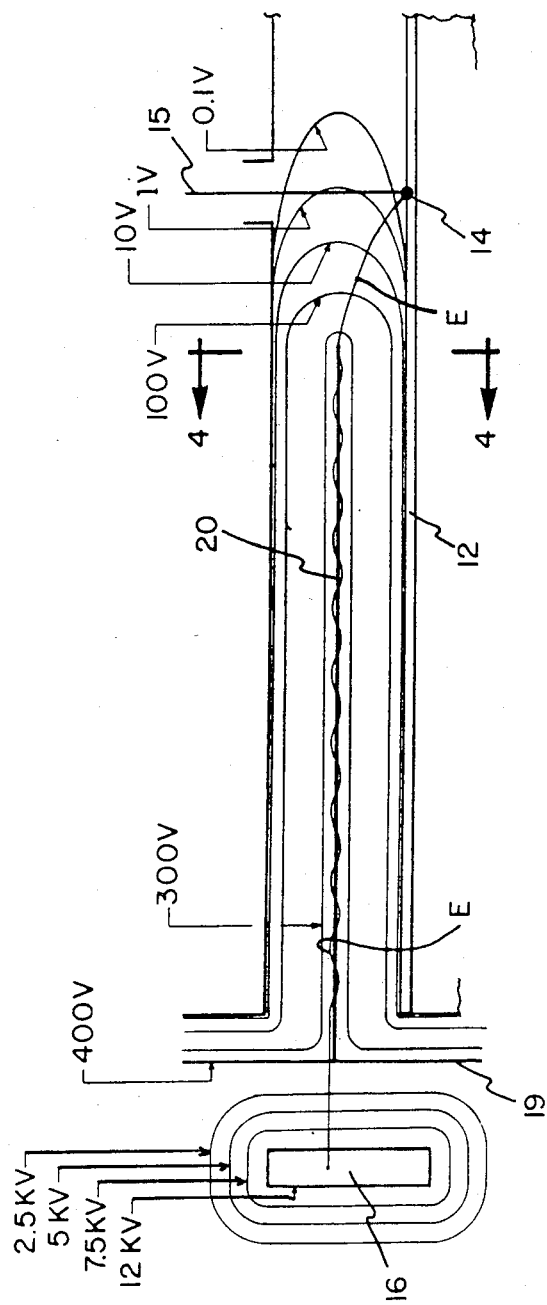
FIG. 3 illustrates in side view the electrical field set up by a modification of the structure of FIG. 1.
Figure 4:
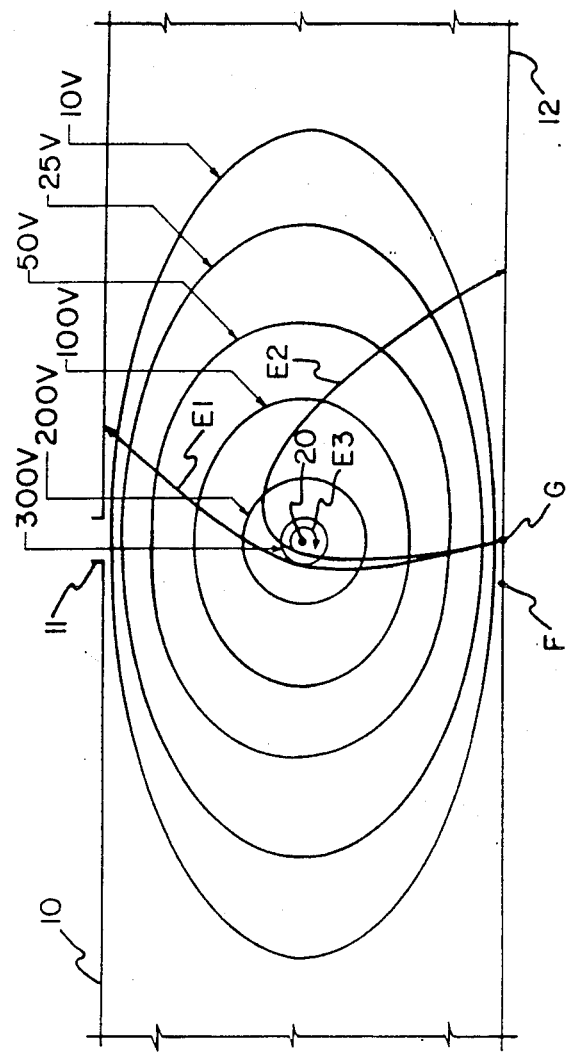
FIG. 4 illustrates the same field in end view, i.e. taken on the line 4—4 in FIG. 3.

A further characteristic feature of the present invention is the provision of an elongate probe in the form of a wire 20 that is mechanically supported at one end by the cage 19 through an insulator 31. A lead 32 serves to apply a voltage to the wire 20. This voltage can be the same (e.g. 400 V) as applied to the cage 19, or it may be lower. It should not be higher than the voltage on the cage. As an alternative, if these voltages are to be the same, the wire 20 can be electrically connected to the cage 19 in which case the insulator 31 and lead 32 are not needed. It is this simplified construction that is shown in FIGS. 3 and 4 and which was used to determine the data shown in FIG. 5. The wire 20 projects in a plane parallel to the specimen surface into the confined space between the lens 10 and the specimen 12 to terminate at a tip 21 in the general vicinity of, but short of the impact point 14.

Figure 2B:
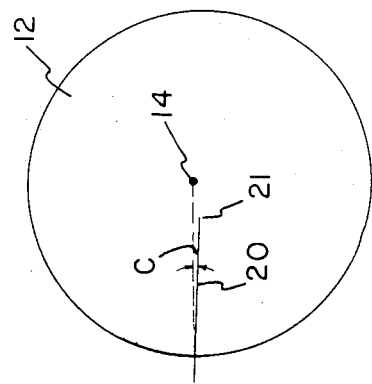
FIG. 2B shows a modification to the structure of the embodiment of FIG. 2A.
Figure 2A:
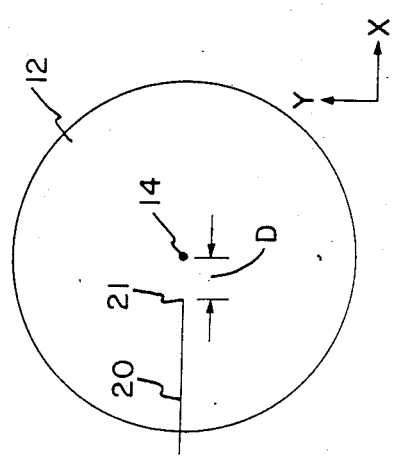
FIG. 2A is a plan view of the embodiment of FIG. 1, taken on the line 2A—2A in FIG. 1.

In the embodiment of FIG. 2A the wire 20 extends directly towards the point 14, i.e. so that, although it stops short of the beam 15, its direction is such that it would intersect such beam which is assumed to extend normal to the specimen surface.

In the embodiment of FIG. 2B the wire is directed at an angle C of about 2° to 3° to the line (shown broken) intersecting the beam 15.

The wire 20 should have a small diameter, while still being self supporting. It has been found that a stainless steel or tungsten wire with a diameter of about 0.25 mm. and a length of about 5 cm. satisfactorily meets these requirements. As an alternative, the single wire probe can be replaced by one comprising a plurality of wires extending parallel to each other and close together.

In the embodiment of FIG. 2A the dimension D, i.e. the spacing of the wire tip 21 from the beam 15 is about 1 cm. and the corresponding distance in FIG. 2B will be similar.

FIG. 3 illustrates with equipotential lines a typical electrostatic field set up by the scintillation surface 16, the cage 19 and the wire 20 (assuming the cage and wire to be electrically common), and a typical path E of a secondary electron emitted from the point 14. It will be noted that the electron is assumed to orbit the wire 20 while travelling to the scintillation surface 16.

FIG. 4 shows an end view of this field taken in a vertical plane through the wire tip 21 and some typical electron paths E1, E2 and E3. Some of these electrons, e.g. E1, strike and are absorbed by the surface of the lens 10, some, e.g. E2, by other parts of the specimen, but an appreciable percentage of the electrons, e.g. E3, is caused to orbit the wire 20 while being rapidly accelerated towards the scintillation surface. Since the back scattered electrons (with high energy levels) will follow paths like E1, while only the secondary electrons, with lower energy levels, will orbit the probe in path E3, the arrangement has an energy selection function, i.e. to separate (and count) the secondary electrons, from the back scattered electrons which it is desired to exclude from the count. To prevent the back scattered electrons that strike the surface of the lens 10 from themselves generating secondary electrons that might be captured by the probe, this surface can be coated with a suitable material such as carbon.

It can be shown theoretically, and has been confirmed in practice, that a larger number of electrons will orbit the wire 20 and eventually reach the scintillation surface, if the point of departure F of the electrons is offset from the wire 20 (corresponding to FIG. 2B) than if the point of departure G is aligned with the wire 20 (corresponding to FIG. 2A).

Figure 5:
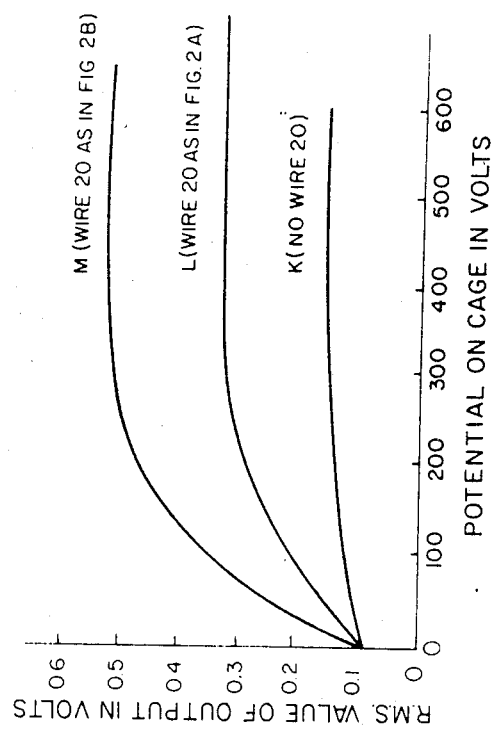
FIG. 5 is a graph showing the performance of the various embodiments of the invention.

FIG. 5 provides an experimentally determined comparison between the RMS value in volts of the output signal from the photomultiplier tube 18 and the voltage on the cage 19 for curve K (no wire 20), curve L (aligned wire, the FIG. 2A embodiment) and curve M (offset wire, the FIG. 2B embodiment) This graph indicates that above about 300 volts any further increase in the cage and probe potential has little effect. It also demonstrates the remarkable improvement afforded by use of the wire 20, especially when it is offset. The optimum angle of offsetting is believed to be in the area of 2° to 3°.

Figure 6:
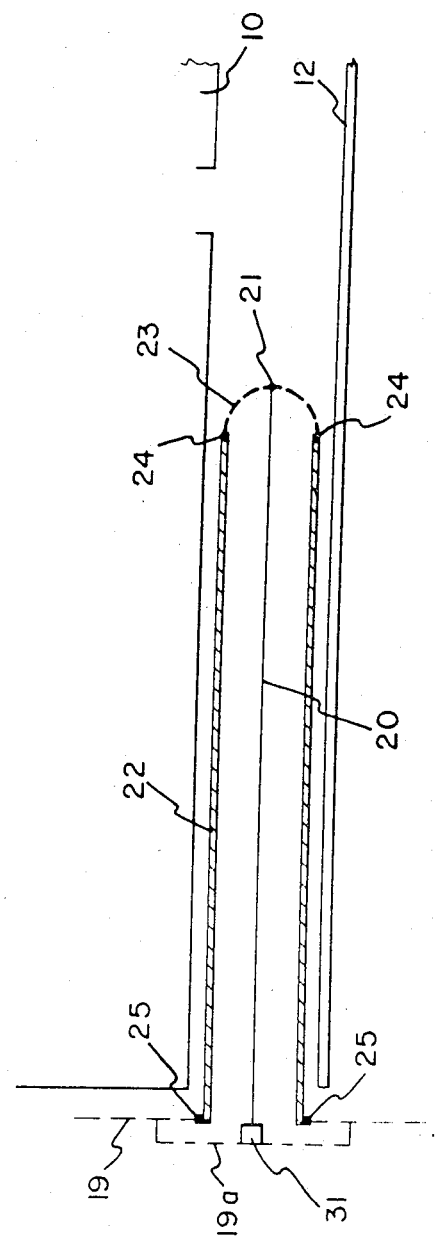
FIG. 6 is a side view of a further modification.

FIG. 6 shows a modification in which the wire 20 is protected by a thin walled tube 22, the tip 21 of the wire carrying a curved grid 23 that is connected to the remote end of the tube 22 by insulating (epoxy) resin 24. The other end of the tube 22 is connected by similar resin 25 to the cage 19, the wire 20 being supported through the insulator 31 by a bridge portion 19a of the cage 19. The electrical performance of this arrangement has been found to be essentially the same as illustrated in FIG. 5. It has the advantage, however, that the wire is protected from physical damage and is supported at its remote end.

The tube 22 will preferably be maintained either at ground or a slightly negative potential to repel the electrons and achieve a more stable electron confinement in the area around the wire 20. Since the electrons have a velocity component along the wire 20, this temporary trapping action can be expected to increase the number of electrons that reach the scintillation surface, and hence this arrangement may be found advantageous if it is found desirable to extend even further the "reach" of the device.

Other variations are possible. For example, the tube 22 can be replaced by wires arranged parallel to and surrounding the wire 20.

When the invention is applied to a detector for detecting positive ions, the sign of the applied voltages will be reversed.

If it is desired to increase the distance B substantially, the voltage on the probe 20 may require to be reduced below that on the cage 19. A similar reduction may be desired if the platform 13 is moved so far to the right in FIG. 1 that the impact point 14 is at or near the edge of the specimen 12. Such reductions are necessary to ensure that, if the impact point 14 is no longer truly in a confined space, a flat response is still obtained, i.e. too many electrons do not reach the scintillator surface 16 to saturate the detection operation and distort the data supplied to the computer. It is for this reason that there will often be need to retain the flexibility of charging the probe to a potential lower than that on the cage.

If the right hand edge of specimen 12 as seen in FIG. 1 is to be inspected, the platform 13 is first rotated through 180° and then moved to the right.

We claim:

1. A detector for detecting secondary charged particles emitted by an area of a specimen in response to particle beam bombardment thereof, said area being located in a confined space, said detector comprising
    (a) means including a particle detecting device for providing an output proportional to the number of said secondary charged particles received by such device,
    (b) means for applying to the particle detecting device a first voltage of opposite sign to that of the charge on the secondary particles,
    (c) a grid located between the detecting device and the bombardment area,
    (d) means for applying to the grid a second voltage no greater than, and of the same sign as, the first voltage, and
    (e) an elongate probe projecting into the vicinity of said bombardment area in said confined space, and
    (f) means for applying to the probe a third voltage no greater than, and of the same sign as, the second voltage whereby to set up an electrostatic field around said probe to cause said secondary charged particles to orbit the probe and travel to the detecting device.

2. A detector according to claim 1, wherein said probe comprises a thin wire.

3. A detector according to claim 1, wherein said probe extends in a direction that is orthogonal to and intersects the axis of said particle beam.

4. A detector according to claim 1, wherein said probe extends in a direction that makes a small angle with a direction that is orthogonal to and intersects the axis of said particle beam.

5. A detector according to claim 4, wherein said angle is approximately in the range of 2° to 3°.

6. A detector according to claim 1, wherein said probe is supported at one end by the grid while being electrically insulated therefrom, and is self supporting throughout its length.

7. A detector according to claim 1, wherein said probe is electrically common with the grid.

8. A detector according to claim 7, wherein said probe is supported at one end by the grid and is self supporting throughout its length.

9. A detector according to claim 1, including a protective tube surrounding the probe, said tube being supported at one end by the grid while being electrically insulated therefrom and the probe being supported at its remote end by the tube while being electrically insulated therefrom, and means for maintaining the tube at a ground potential or at a potential of the same sign as the secondary charged particles.

10. A detector according to claim 1, wherein the instrument is a scanning electron microscope, the secondary charged particles are electrons and the particle detecting device and grid are positively charged.

11. A detector according to claim 10, wherein said particle detecting device is a scintillation surface and wherein sais scintillation surface is biased to a voltage of at least about 8 kV and the voltage on the grid is at least about 300 V.

12. A detector according to claim 10, wherein the probe comprises a thin wire.

13. A detector according to claim 10, wherein the probe comprises a plurality of wires extending parallel to each other and close together.

14. A detector according to claim 10, wherein the probe extends in a direction that is orthogonal to and intersects the axis of said particle beam.

15. A detector according to claim 10, wherein the probe extends in a direction that makes a small angle with a direction that is orthogonal to and intersects the axis of said particle beam.

16. A detector according to claim 15, wherein said angle is approximately in the range of 2° to 3°.

* * * * *